United States Patent
Ando et al.

(10) Patent No.: US 10,405,429 B2
(45) Date of Patent: Sep. 3, 2019

(54) TRANSFORMER INTEGRATED TYPE PRINTED CIRCUIT BOARD

(71) Applicants: Masanori Ando, Aichi (JP); Takashi Yamaguchi, Guangzhou (CN)

(72) Inventors: Masanori Ando, Aichi (JP); Takashi Yamaguchi, Guangzhou (CN)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/987,665

(22) Filed: May 23, 2018

(65) Prior Publication Data

US 2018/0343742 A1 Nov. 29, 2018

(30) Foreign Application Priority Data

May 23, 2017 (JP) .................. 2017-101662

(51) Int. Cl.
  *H01F 27/28* (2006.01)
  *H05K 1/16* (2006.01)
  *H05K 1/11* (2006.01)
  *H05K 1/02* (2006.01)

(52) U.S. Cl.
  CPC ......... *H05K 1/165* (2013.01); *H01F 27/2804* (2013.01); *H05K 1/115* (2013.01); *H01F 2027/2809* (2013.01); *H01F 2027/2819* (2013.01); *H05K 1/0298* (2013.01);
  (Continued)

(58) Field of Classification Search
  CPC .............. H05K 1/165; H05K 1/115; H05K 2201/09227; H05K 2201/09063; H05K 2201/086; H05K 1/0298; H01F 27/2804; H01F 2027/2809; H01F 2027/2819
  See application file for complete search history.

(56) References Cited

U.S. PATENT DOCUMENTS 7,248,138 B2 * 7/2007 Chiang ............... H01F 27/2804
                                                174/260
8,841,984 B1 * 9/2014 Wambsganss ...... H01F 27/2804
                                                336/200

(Continued)

FOREIGN PATENT DOCUMENTS

| JP | 2008-004823 A | 1/2008 |
| JP | 2015-118986 A | 6/2015 |
| WO | 2013-046259 A1 | 4/2013 |

OTHER PUBLICATIONS

JPWO 2013-046259 English Translation (Year: 2013).*

*Primary Examiner* — Steven T Sawyer

(74) *Attorney, Agent, or Firm* — Osha Liang LLP

(57) ABSTRACT

A transformer integrated type printed circuit board includes: a transformer including a core, a primary winding wire, and a secondary winding wire; and a printed circuit board including a surface layer and an internal layer in which wiring patterns are respectively formed, and having a plurality of insertion portions into which a plurality of leg portions of the core are respectively inserted. The primary winding wire is disposed in the surface layer of the printed circuit board so as to be wound between the leg portions, and the secondary winding wire is disposed in the internal layer of the printed circuit board so as to be wound between the leg portions. The primary winding wire is small in number of windings, is large in width, and is large in thickness, in comparison with the secondary winding wire.

6 Claims, 13 Drawing Sheets

(52) U.S. Cl.
CPC ............... *H05K 2201/086* (2013.01); *H05K 2201/09063* (2013.01); *H05K 2201/09227* (2013.01)

(56) References Cited

U.S. PATENT DOCUMENTS

| | | | |
|---|---|---|---|
| 2014/0167901 A1* | 6/2014 | Persson | H01F 27/323 336/200 |
| 2015/0130574 A1* | 5/2015 | Eom | H01F 27/2804 336/83 |

* cited by examiner

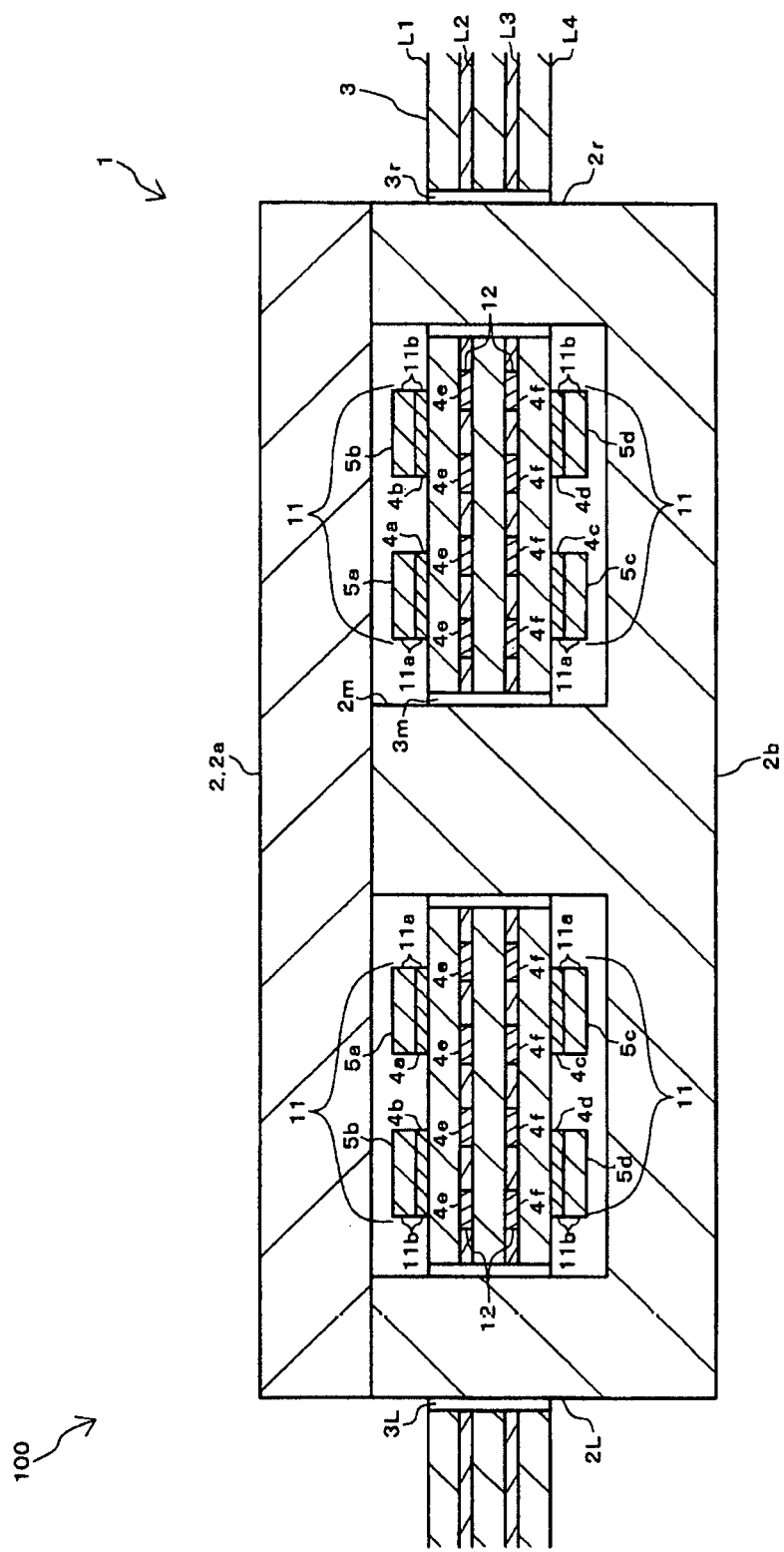

<L2: UPPER SIDE INTERNAL LAYER>

<A-A SECTIONAL VIEW>

<B-B SECTIONAL VIEW>

<C-C SECTIONAL VIEW>

<D-D SECTIONAL VIEW>

TRANSFORMER INTEGRATED TYPE PRINTED CIRCUIT BOARD

CROSS-REFERENCES TO RELATED APPLICATIONS

This application is based upon and claims the benefit of priority from Japanese Patent Application No. 2017-101662, filed on May 23, 2017; the entire contents of which are incorporated herein by reference.

FIELD

One or more embodiments of the present invention relate to a transformer integrated type printed circuit board in which a winding wire of a transformer is mounted on a printed circuit board.

BACKGROUND

For example, as disclosed in WO-A1-2013/046259, JP-A-2015-118986, and JP-A-2008-4823, there is a printed circuit board on which a winding wire of a transformer or a choke coil is mounted.

In WO-A1-2013/046259, JP-A-2015-118986, and JP-A-2008-4823, a core of the transformer or the choke coil is used as a pair of upper and lower cores, and an E core which is formed into an E shape is used in at least one of the pair. In the E core, three leg portions are provided to be parallel to each other in one direction. Each leg unit is inserted into an insertion portion such as a penetration hole or a notch which is formed in the printed circuit board. The winding wire is wound around a middle leg portion to be fit into between the middle leg portion and left and right leg portions which are on left and right of the middle leg portions. The core forms a magnetic path of a magnetic flux which interlinks with the winding wire.

In WO-A1-2013/046259, a primary winding wire of a transformer is formed of a wiring pattern that is formed in each of surface layers which are disposed on both board surfaces of a multilayered printed circuit board, and a secondary winding wire is formed of the wiring patterns that are formed in a plurality of internal layers of the printed circuit board. The wiring patterns of the primary winding wires that are formed in the surface layers which are different from each other, are electrically connected to each other by a through-hole which is formed in the printed circuit board. The wiring patterns of the secondary winding wires that are formed in the internal layers which are different from each other, are electrically connected to each other by the through-hole which is formed in the printed circuit board. Since an electric current which is larger than that of the secondary winding wire flows through the primary winding wire of the transformer, a width of the primary winding wire is larger than that of the secondary winding wire.

In JP-A-2015-118986, a portion of a winding wire of a choke coil is formed of a wiring pattern which is formed in an internal layer of a printed circuit board, and the other portion of the winding wire is formed of a coil winding wire which is mounted on a surface of the printed circuit board. A portion and the other portion of the winding wire are electrically connected by a through-hole which is formed in the printed circuit board.

In JP-A-2008-4823, a first coil on a primary side of a transformer is formed of a wiring pattern which is formed in a printed circuit board, and a second coil on the primary side is formed of a winding wire that is mounted on an upper surface of the printed circuit board and has a small width. A coil on a secondary side is formed of a winding wire that is mounted on a lower surface of the printed circuit board and has a large width, and a winding wire that is mounted on the upper surface of the printed circuit board and has a large width, to be positioned above in comparison with the second coil on the primary side. An insulating sheet is disposed between the printed circuit board and the winding wire or between the winding wires. The wiring pattern and the winding wire, and the winding wires are electrically connected to each other by a through-hole which is formed in the printed circuit board.

SUMMARY

In a case where the electric current which is larger than that of the secondary winding wire flows through the primary winding wire of the transformer, there is a need to make a sectional area of the primary winding wire large in order to cause the large electric current to stably flow through the primary winding wire. In a case where the primary winding wire of the transformer is disposed in the surface or the like of the printed circuit board as the related art, if the width of the primary winding wire is made large in order to make the sectional area of the primary winding wire large, there is a concern that an occupied area of the primary winding wire on the printed circuit board becomes large, and the primary winding wire is not fit into between the leg portions of the core.

One or more embodiments of the present invention provide a transformer integrated type printed circuit board that is capable of causing an electric current to stably flow through each winding wire of a transformer, and keeping down an occupied area of each winding wire on a printed circuit board small.

According to one or more embodiments of the present invention, there is provided a transformer integrated type printed circuit board including: a transformer that includes a core, a primary winding wire, and a secondary winding wire; and a printed circuit board that has a surface layer and an internal layer in which wiring patterns are respectively formed, and has a plurality of insertion portions into which a plurality of leg portions of the core are respectively inserted. The primary winding wire is disposed in the surface layer of the printed circuit board so as to be wound between the leg portions, and the secondary winding wire is disposed in the internal layer of the printed circuit board so as to be wound between the leg portions. The primary winding wire is small in number of windings, is large in width, and is large in thickness, in comparison with the secondary winding wire.

According to one or more embodiments of the present invention, in the transformer integrated type printed circuit board, the primary winding wire is disposed in the surface layer of the printed circuit board, and the secondary winding wire is disposed in the internal layer of the printed circuit board, to be wound between the leg portions of the core in the transformer. The electric current which is larger than that of the secondary winding wire flows through the primary winding wire, and the primary winding wire is large not only in width, but also in thickness in comparison with the secondary winding wire. Therefore, a sectional area of the primary winding wire is made large, thereby, it is possible to cause the large electric current to stably flow through the primary winding wire, and to keep down the occupied area of the primary winding wire on the surface layer of the printed circuit board small. Since the secondary winding wire is small in width, and is small in thickness in comparison with the primary winding wire, the sectional area thereof is made small, but the electric current which is smaller than the electric current flowing through the primary winding wire flows through the secondary winding wire, thereby, it is possible to cause the electric current to stably flow through the secondary winding wire, and to keep down the occupied area of the secondary winding wire on the internal layer of the printed circuit board small.

In one or more embodiments of the present invention, the primary winding wire may include: a first wiring pattern that is formed in the surface layer; and a conductor that is mounted on the first wiring pattern, and the secondary winding wire may include a second wiring pattern which is formed in the internal layer.

In one or more embodiments of the present invention, the conductor of the primary winding wire may include a metal foil which is the same material as the first wiring pattern, and a width of the metal foil may be equal to a width of the first wiring pattern.

Moreover, in one or more embodiments of the present invention, a third wiring pattern that is electrically connected to an input/output terminal portion of the primary winding wire may be formed at a position that is separated from the core in the surface layer, and the third wiring pattern may be large in width, and may be small in thickness, in comparison with the primary winding wire.

In one or more embodiments of the present invention, a fourth wiring pattern that is not electrically connected to an input/output terminal portion of the primary winding wire may be formed at a position that is separated from the core in the surface layer, and the fourth wiring pattern may be small in thickness, in comparison with the primary winding wire.

In one or more embodiments of the present invention, the primary winding wires may be disposed in the surface layers that are formed on both of board surfaces of the printed circuit board, the secondary winding wires may be disposed in a plurality of the internal layers that are formed inside the printed circuit board, and the printed circuit board may have: a first through-hole that electrically connects the primary winding wires to each other in the surface layers that are different from each other; and a second through-hole that electrically connects the secondary winding wires to each other in the internal layers which are different from each other.

Furthermore, in one or more embodiments of the present invention, the core may include three leg portions that are formed to be parallel to each other in one direction, and the primary winding wire and the secondary winding wire may be wound around a middle leg portion to be fit into between the middle leg portion of the three leg portions and left and right leg portions which are located on left and right of the middle leg portion.

According to one or more embodiments of the present invention, it is possible to provide a transformer integrated type printed circuit board that is capable of causing an electric current to stably flow through each winding wire of a transformer, and keeping down an occupied area of each winding wire on a printed circuit board small.

BRIEF DESCRIPTION OF DRAWINGS

FIG. 4 is a sectional view of the transformer integrated type printed circuit board in FIG. 1;

DETAILED DESCRIPTION

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

Hereinafter, one or more embodiments of the present invention will be described with reference to the drawings. In each drawing, the same marks will be attached to the same portions or the corresponding portions.

First, an electric circuit of a transformer integrated type printed circuit board according to the embodiment of the present invention will be described with reference to FIG. 1.

Figure 1:
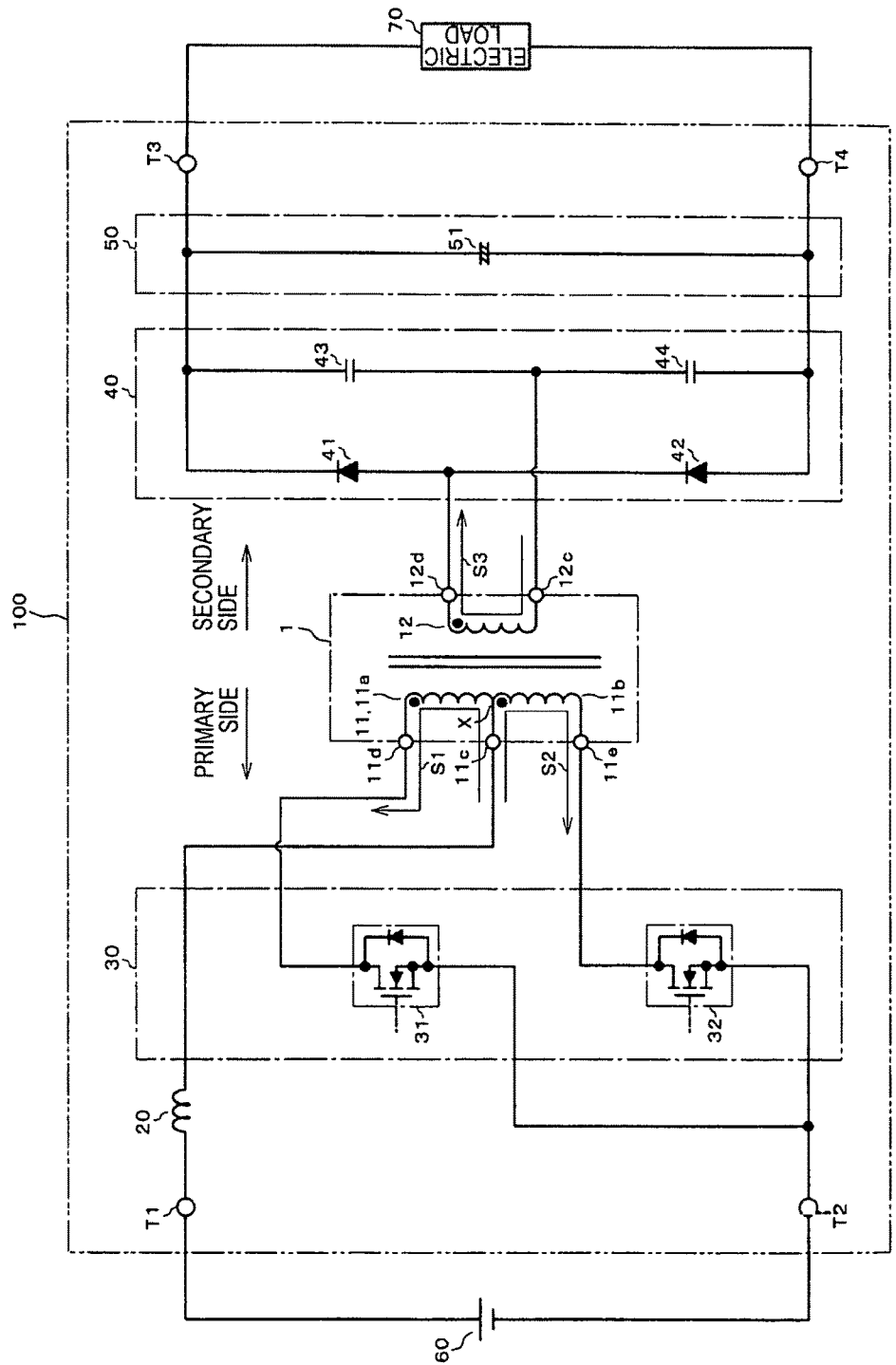
FIG. 1 is an electric circuit diagram of a transformer integrated type printed circuit board according to an embodiment of the present invention.

FIG. 1 is an electric circuit diagram of a transformer integrated type printed circuit board 100. For example, the transformer integrated type printed circuit board 100 is used in a switching power source apparatus which is installed in an electric vehicle (or a hybrid car). In the transformer integrated type printed circuit board 100, the electric circuit of a DC-DC converter as illustrated in FIG. 1 is formed.

Specifically, in the transformer integrated type printed circuit board 100 a choke coil 20, a switching circuit 30, a transformer 1, a rectifier circuit 40, and a smoothing circuit 50 are formed. The transformer integrated type printed circuit board 100 is provided with input side terminals T1 and T2, and output side terminals T3 and T4.

On a primary side (low voltage side) of the transformer 1, the input side terminals T1 and T2, the choke coil 20, and the switching circuit 30 are disposed. On a secondary side (high voltage side) of the transformer 1, the rectifier circuit 40, the smoothing circuit 50, and the output side terminals T3 and T4 are disposed.

The input side terminal T1 is connected to a positive electrode of a vehicle-mounted battery 60, and the input side terminal T2 is connected to a negative electrode of the vehicle-mounted battery 60. One end of the choke coil 20 is connected to the input side terminal T1, and the other end of the choke coil 20 is connected to an input terminal portion 11c of a primary winding wire 11 of the transformer 1. The input terminal portion 11c is connected to a center tap X that divides the primary winding wire 11 into a winding wire 11a and a winding wire 11b.

The switching circuit 30 is provided with switching elements 31 and 32. For example, the switching elements 31 and 32 are formed of a metal oxide semiconductor-field effect transistor (MOS-FET).

A drain of the switching element 31 is connected to an output terminal portion 11d of the winding wire 11a of the transformer 1. A source of the switching element 31 is connected to the input side terminal T2. The drain of the switching element 32 is connected to an output terminal portion 11e of the winding wire 11b of the transformer 1. The source of the switching element 32 is connected to the input side terminal T2.

Gates of the switching elements 31 and 32 are connected to a control circuit which is not illustrated in the drawing. The control circuit causes the switching elements 31 and 32 to be ON or OFF, by inputting a drive signal to the gates of the switching elements 31 and 32. Such a control circuit may be formed in the transformer integrated type printed circuit board 100, or may be formed in another printed circuit board which is included in the switching power source apparatus.

The rectifier circuit 40 is provided with rectifier diodes 41 and 42, and capacitors 43 and 44. The rectifier diodes 41 and 42 are connected to each other in series. Specifically, an anode of the rectifier diode 41 is connected to a cathode of the rectifier diode 42. The capacitors 43 and 44 are connected to each other in series.

One end of the capacitor 43 is connected to the cathode of the rectifier diode 41. One end of the capacitor 44 is connected to the anode of the rectifier diode 42. That is, the rectifier diodes 41 and 42, and the capacitors 43 and 44 are connected to each other in parallel.

An input terminal portion 12c of a secondary winding wire 12 of the transformer 1 is connected to a connection point of the capacitors 43 and 44. An output terminal portion 12d of the secondary winding wire 12 of the transformer 1 is connected to the connection point of the rectifier diodes 41 and 42.

The smoothing circuit 50 is provided with a smoothing capacitor 51. One end of the smoothing capacitor 51 is connected to one end of the capacitor 43. The smoothing capacitor 51 is connected to the rectifier diodes 41 and 42, and the capacitors 43 and 44 in parallel.

The output side terminal T3 is connected to one end of the smoothing capacitor 51, and the output side terminal T4 is connected to the other end of the smoothing capacitor 51. The output side terminals T3 and T4 are connected to an electric load (vehicle-mounted device) 70.

The switching element 31 is caused to be ON by the control circuit which is not illustrated in the drawing, thereby, an electric current which is input to the input side terminal T1 from the positive electrode of the vehicle-mounted battery 60 flows to one winding wire 11a of the primary winding wire 11 from the input terminal portion 11c of the transformer 1, as illustrated by an arrow S1, through the choke coil 20. After the electric current flowing through the winding wire 11a is output from the output terminal portion 11d, the electric current flows to the negative electrode of the vehicle-mounted battery 60 from the input side terminal T2, through the switching element 31.

The switching element 32 is caused to be ON, thereby, the electric current which is input to the input side terminal T1 from the positive electrode of the vehicle-mounted battery 60 flows to the other winding wire 11b of the primary winding wire 11 from the input terminal portion 11c of the transformer 1, as illustrated by an arrow S2, through the choke coil 20. After the electric current flowing through the winding wire 11b is output from the output terminal portion 11e, the electric current flows to the negative electrode of the vehicle-mounted battery 60 from the input side terminal T2, through the switching element 32.

The electric current is caused to flow through the primary winding wire 11 of the transformer 1 as described above, thereby, electric energy is accumulated in the primary winding wire 11. The switching elements 31 and 32 are caused to be OFF by the control circuit, thereby, the electric energy which is accumulated in the primary winding wire 11 of the transformer 1 is released, and the electric current flows toward the output terminal portion 12d from the input terminal portion 12c in the secondary winding wire 12 of the transformer 1, as illustrated by an arrow S3. At that time, a voltage on a secondary side of the transformer 1 is rectified by the rectifier diodes 41 and 42, and is smoothed by the smoothing capacitor 51, thereby, a direct current voltage of a size which is necessary for driving of the electric load 70 is generated. The direct current voltage is supplied to the electric load 70 from the output side terminals T3 and T4.

Next, a structure of the transformer integrated type printed circuit board 100 will be described with reference to FIGS. 2 to 12B.

Figure 2:
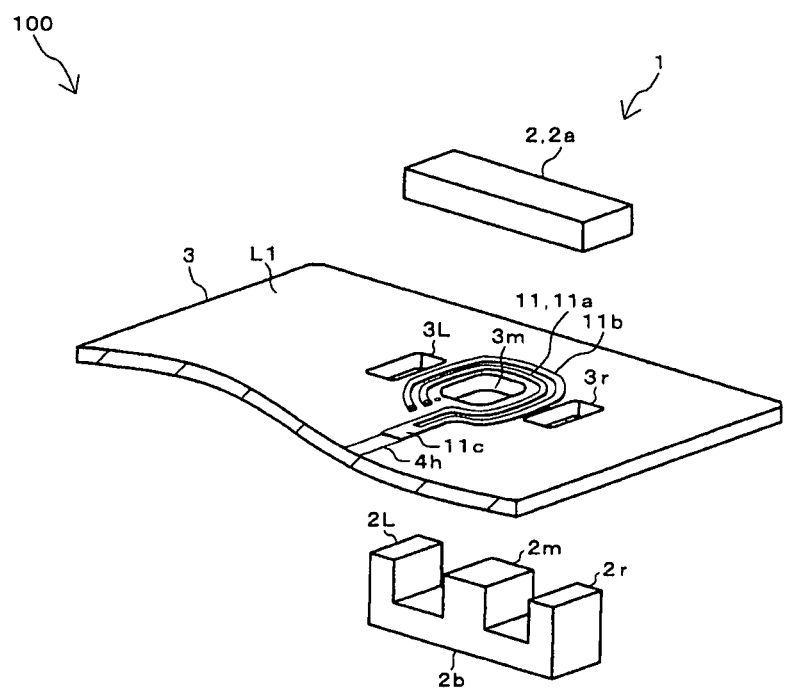
FIG. 2 is an exploded perspective view of the transformer integrated type printed circuit board in FIG. 1.
Figure 3:
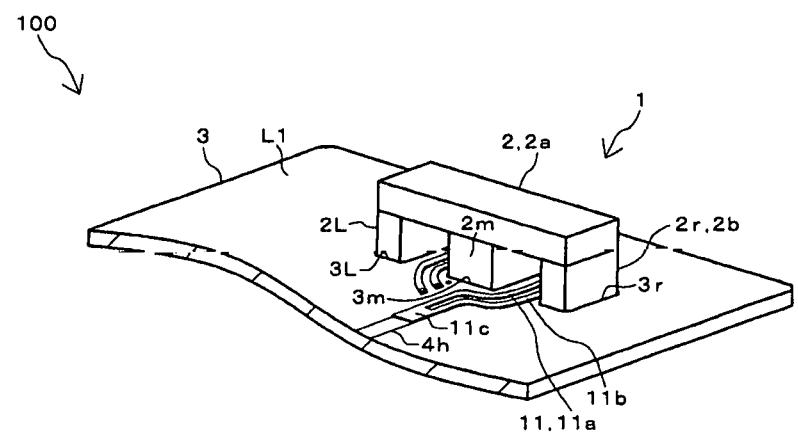
FIG. 3 is an assembling perspective view of the transformer integrated type printed circuit board in FIG. 1.

FIG. 2 is an exploded perspective view of the transformer integrated type printed circuit board 100. FIG. 3 is an assembling perspective view of the transformer integrated type printed circuit board 100. FIG. 4 is a sectional view of the transformer integrated type printed circuit board 100. FIGS. 2 to 4 illustrate the structure of the vicinity of the transformer 1 in the transformer integrated type printed circuit board 100. FIGS. 5A to 5D described later are similar thereto.

As illustrated in FIG. 2, the transformer integrated type printed circuit board 100 includes the transformer 1, and a printed circuit board 3. The transformer 1 includes the primary winding wire 11, the secondary winding wire 12 illustrated in FIG. 1, and a core 2.

The core 2 is formed of a pair of two cores as a core (referred to as "I core", hereinafter) 2a which is formed into an I shape, and a core (referred to as "E core", hereinafter) 2b which is formed into an E shape, when viewed from a direction parallel to the printed circuit board 3. The I core 2a and the E core 2b are formed into a rectangular shape, when viewed from a direction perpendicular to the printed circuit board 3. The I core 2a and the E core 2b are formed of a magnetic substance such as ferrite or amorphous metal. The E core 2b has three leg portions 2r, 2m, and 2L. The three leg portions 2r, 2m, and 2L are formed in the E core 2b, to protrude upward and to be parallel to each other in one direction (left and right directions in FIG. 4).

As illustrated in FIG. 4, the printed circuit board 3 is formed of a multilayered (four-layered) printed circuit board that has surface layers L1 and L4 which are disposed on both board surfaces of an upper side and a lower side, and internal layers L2 and L3 which are disposed on an inside thereof. In the upper side surface layer L1 and the lower side surface layer L4 of the printed circuit board 3, a portion of the wiring of the electric circuit illustrated in FIG. 1 is formed, and an electronic component is mounted (the detailed illustration thereof will be omitted). In the upper side internal layer L2 and the lower side internal layer L3, the other portion of the wiring of the electric circuit illustrated in FIG. 1 is formed.

As illustrated in FIG. 2, penetration holes 3*r*, 3*m*, and 3L having the rectangular shapes when viewed from above are formed in the printed circuit board 3. The penetration holes 3*r*, 3*m*, and 3L are formed in the printed circuit board 3 to be parallel to each other in one direction (left and right directions in FIG. 4). As illustrated in FIG. 4, the leg portions 2*r*, 2*m*, and 2L of the E core 2*b* are respectively inserted into the penetration holes 3*r*, 3*m*, and 3L. The penetration holes 3*r*, 3*m*, and 3L are an example of an "insertion portion" in one or more embodiments of the present invention.

Specifically, the leg portions 2*r*, 2*m*, and 2L of the E core 2*b* are respectively inserted into the penetration holes 3*r*, 3*m*, and 3L from below the printed circuit board 3. At that time, the leg portion 2*m* which is disposed in the middle of the E core 2*b* is inserted into the penetration hole 3*m* of the middle among three penetration holes 3*r*, 3*m*, and 3L of the printed circuit board 3. The left leg portion 2L which is disposed on a left side with respect to the middle leg portion 2*m* of the E core 2*b* is inserted into the penetration hole 3L on the left side of the middle penetration hole 3*m* of the printed circuit board 3. The right leg portion 2*r* which is disposed on a right side with respect to the middle leg portion 2*m* of the E core 2*b* is inserted into the penetration hole 3*r* on the right side of the middle penetration hole 3*m* of the printed circuit board 3.

Therefore, the I core 2*a* and the E core 2*b* are fixed to the printed circuit board 3, by fixing means which is not illustrated in the drawing, in combination with the I core 2*a* to the leg portions 2*m*, 2L, and 2*r* of the E core 2*b* from above the printed circuit board 3. Thereby, as illustrated in FIG. 4, the core 2 is assembled with the printed circuit board 3. There is a case where a gap is disposed between the I core 2*a* and the leg portions 2*m*, 2L, and 2*r*.

Figure 5A:
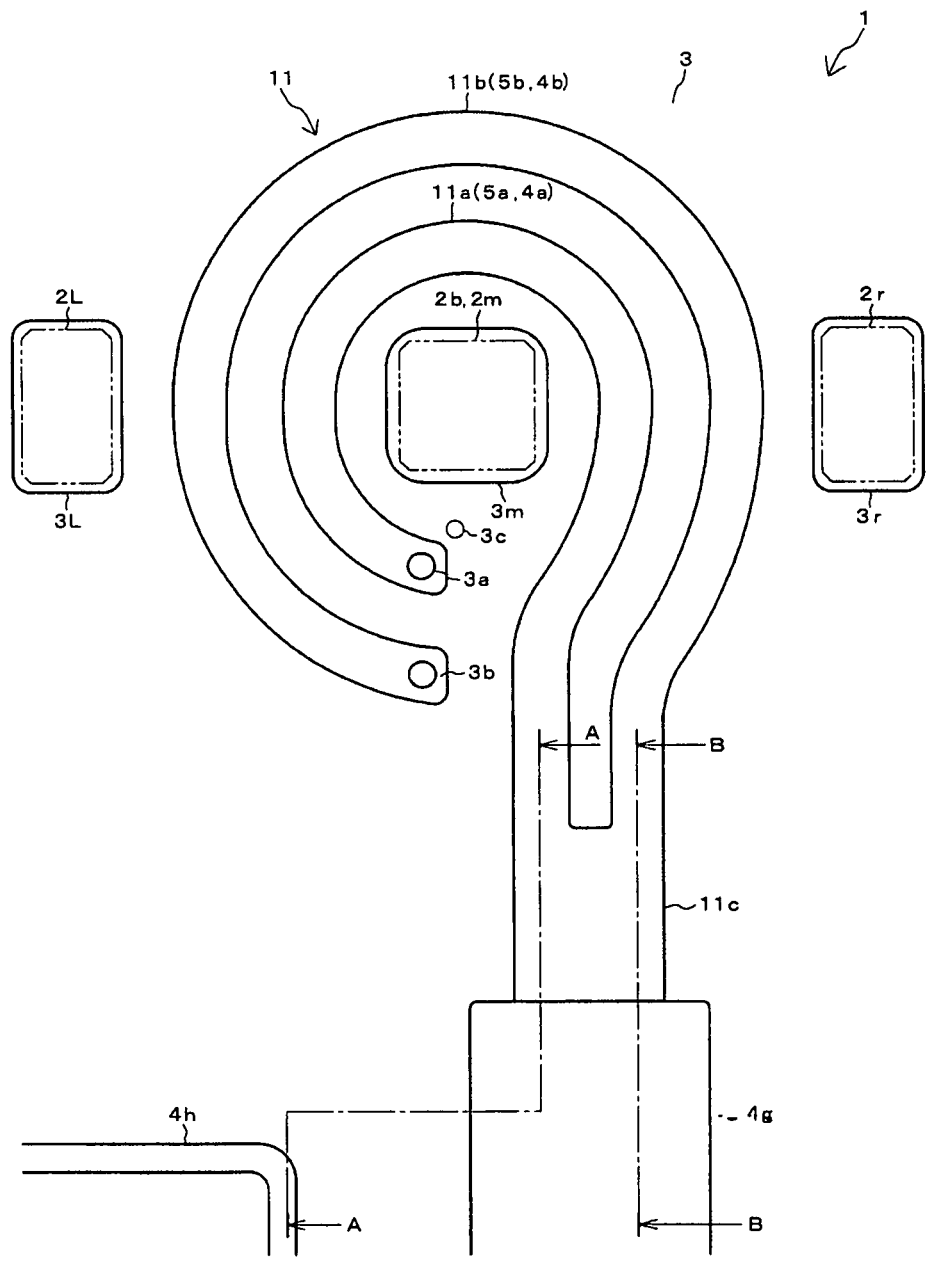
FIG. 5A is a diagram of an upper side surface layer of a printed circuit board in FIG. 3 when viewed from above.
Figure 5B:
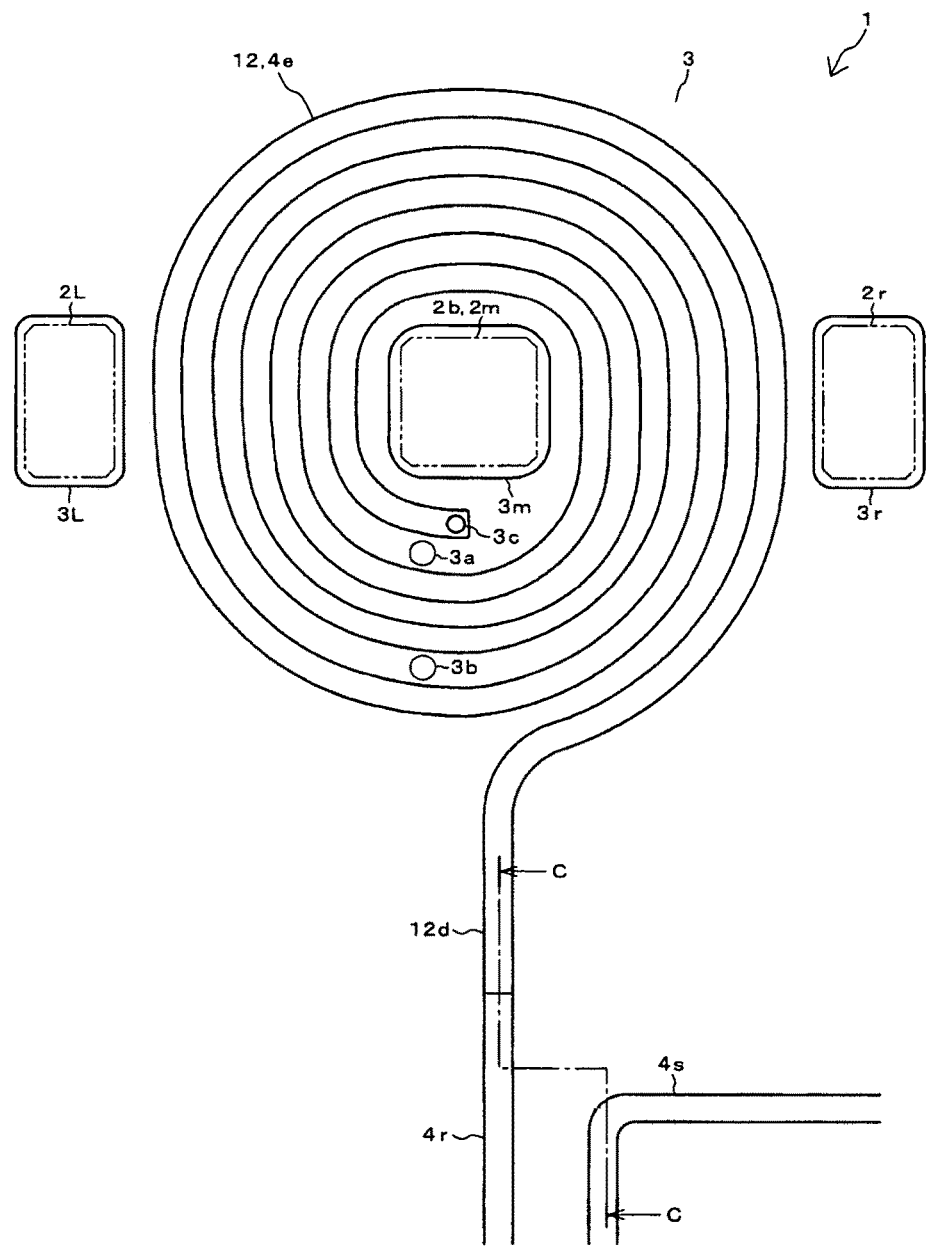
FIG. 5B is a diagram of an upper side internal layer of the printed circuit board in FIG. 3 when viewed from above.
Figure 5C:
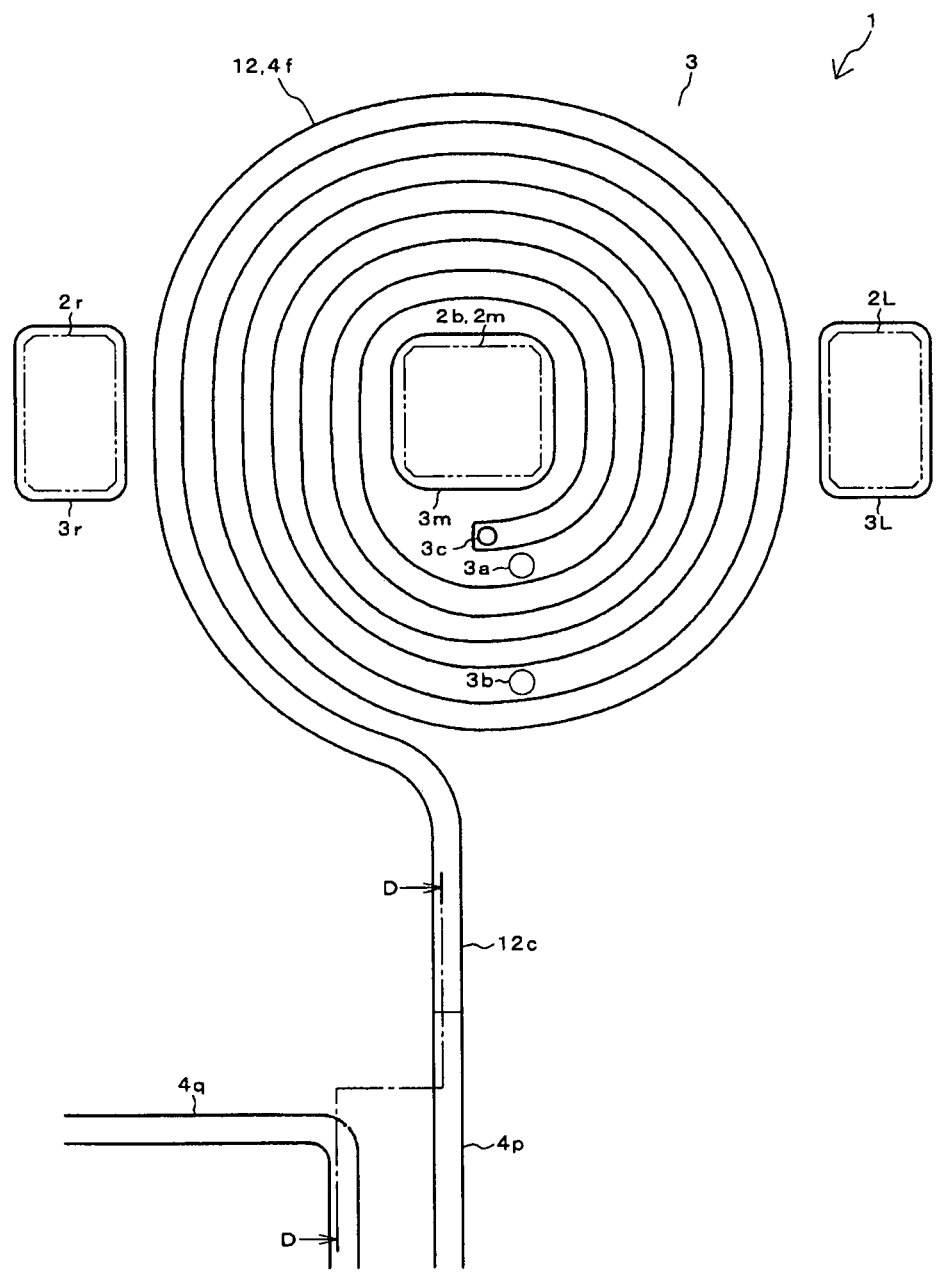
FIG. 5C is a diagram of a lower side internal layer of the printed circuit board in FIG. 3 when viewed from below.
Figure 5D:
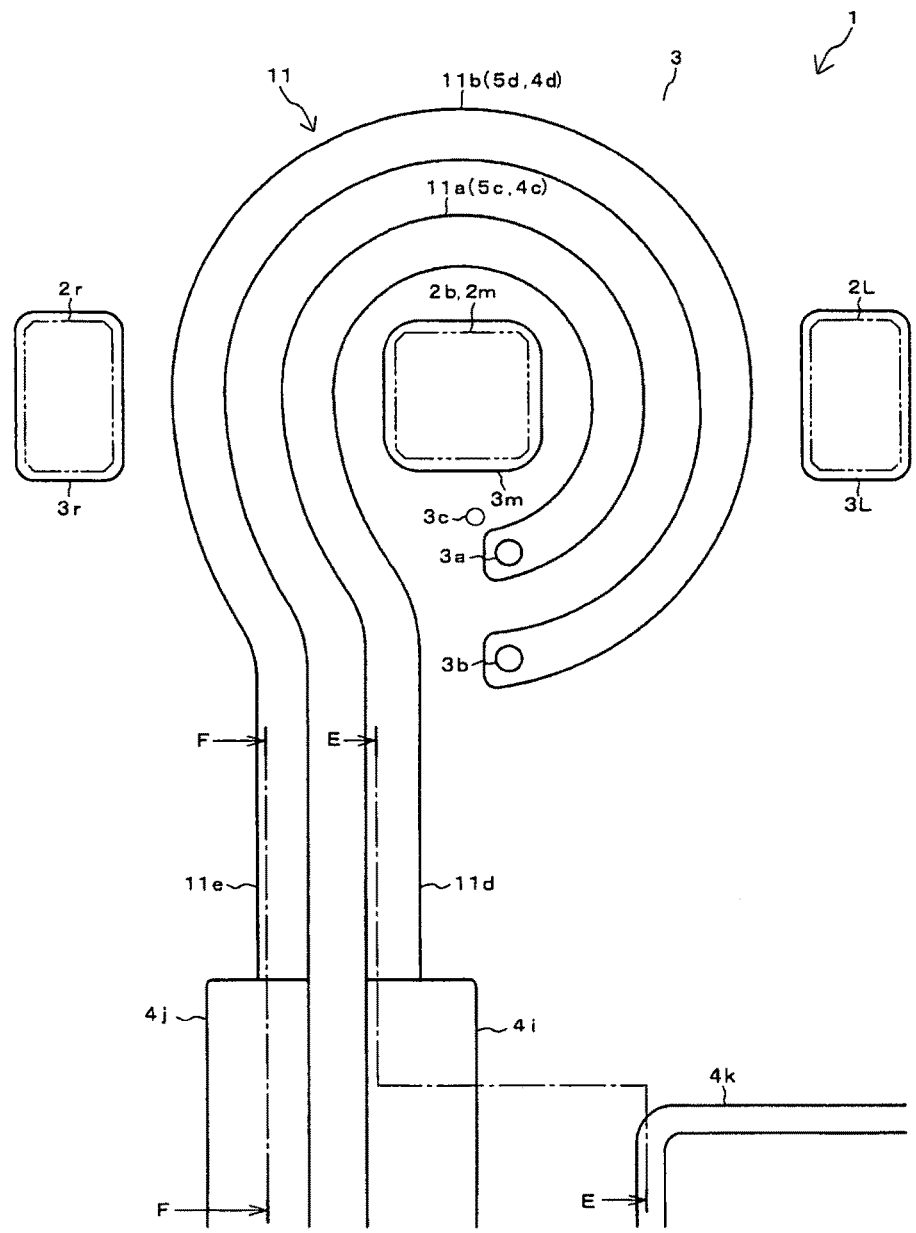
FIG. 5D is a diagram of a lower side surface layer of the printed circuit board in FIG. 3 when viewed from below.

FIG. 5A is a diagram of the upper side surface layer L1 of the printed circuit board 3 when viewed from above. FIG. 5B is a diagram of the upper side internal layer L2 of the printed circuit board 3 when viewed from above. FIG. 5C is a diagram of the lower side internal layer L3 of the printed circuit board 3 when viewed from below. FIG. 5D is a diagram of the lower side surface layer L4 of the printed circuit board 3 when viewed from below. In FIGS. 5A to 5D, the leg portions 2*m*, 2L, and 2*r* of the core 2 are illustrated by a two-dot chain line.

As illustrated in FIGS. 5A, 5D, and 4, the primary winding wire 11 of the transformer 1 is wound in the respective surface layers L1 and L4 of the printed circuit board 3, to be wound between the leg portions 2*m*, 2L, and 2*r* of the E core 2*b*. As described above, the primary winding wire 11 is divided into the winding wire 11*a* and the winding wire 11*b* by the center tap X (FIG. 1).

Meanwhile, as illustrated in FIG. 4, one winding wire 11*a* is formed of a wiring pattern 4*a* that is formed in the upper side surface layer L1, a metal foil 5*a* that is mounted on the wiring pattern 4*a*, a wiring pattern 4*c* that is formed in the lower side surface layer L4, and a metal foil 5*c* that is mounted on the wiring pattern 4*c*. The wiring patterns 4*a* and 4*c*, and the metal foils 5*a* and 5*c* are disposed to overlap with each other in a board thickness direction (up and down directions in FIG. 4) of the printed circuit board 3.

For example, the metal foils 5*a* and 5*c*, and the wiring patterns 4*a* and 4*c* are formed of the same conductor materials, such as a copper foil. Widths of the metal foils 5*a* and 5*c* are equal to the widths of the wiring patterns 4*a* and 4*c*. A term of "equal" is referred to as a case where if one dimension is compared with the other dimension, the dimensions are the same (a difference therebetween is zero), or the difference between both dimensions is a slight difference which is less than a predetermined value (the same applies hereinafter).

The metal foil 5*a* is electrically connected to an entire upper surface (surface which is an opposite side to the printed circuit board 3) of the wiring pattern 4*a*, by pressure bonding, soldering, or the like. Therefore, a thickness of the winding wire 11*a* that is formed of the wiring pattern 4*a* and the metal foil 5*a* which are disposed in the upper side surface layer L1, is equal to a sum total of the thickness of the wiring pattern 4*a* and the thickness of the metal foil 5*a*. The width of the winding wire 11*a* is equal to the widths of the wiring pattern 4*a* and the metal foil 5*a*.

The metal foil 5*c* is electrically connected to an entire lower surface (surface which is the opposite side to the printed circuit board 3) of the wiring pattern 4*c*, by pressure bonding, soldering, or the like. Therefore, the thickness of the winding wire 11*a* that is formed of the wiring pattern 4*c* and the metal foil 5*c* which are disposed in the lower side surface layer L4, is equal to the sum total of the thickness of the wiring pattern 4*c* and the thickness of the metal foil 5*c*. The width of the winding wire 11*a* is equal to the widths of the wiring pattern 4*c* and the metal foil 5*c*.

The thicknesses of the metal foils 5*a* and 5*c* are larger than those of the wiring patterns 4*a* and 4*c*. The thickness of the wiring pattern 4*a* is equal to that of the wiring pattern 4*c*. The thickness of the metal foil 5*a* is equal to that of the metal foil 5*c*. Therefore, a portion (the wiring pattern 4*a* and the metal foil 5*a*) of the winding wire 11*a* which is disposed in the upper side surface layer L1, and the other portion (the wiring pattern 4*c* and the metal foil 5*c*) of the winding wire 11*a* which is disposed in the lower side surface layer L4 become equal to each other in thickness, width, and sectional area.

As illustrated in FIG. 5A, a portion of the winding wire 11*a* which is disposed in the upper side surface layer L1 is wound once around the middle leg portion 2*m*, to be fit into between the middle leg portion 2*m*, the left leg portion 2L, and the right leg portion 2*r* of the E core 2*b*. As illustrated in FIG. 4, a portion of the winding wire 11*a* is fit into between the upper surface of the printed circuit board 3 and the lower surface of the I core 2*a*. As illustrated in FIG. 5D, the other portion of the winding wire H*a* which is disposed in the lower side surface layer L4 is wound once around the middle leg portion 2*m*, to be fit into between the middle leg portion 2*m*, the left leg portion 2L, and the right leg portion 2*r* of the E core 2*b*. As illustrated in FIG. 4, the other portion of the winding wire 11*a* is fit into between the lower surface of the printed circuit board 3 and a bottom surface of a concave portion of the E core 2*b*.

As illustrated in FIGS. 5A and 5D, a portion of the winding wire 11*a* which is disposed in the upper side surface layer L1 is electrically connected to the other portion of the winding wire 11*a* which is disposed in in the lower side surface layer L4, by a through-hole 3*a* which is formed in the printed circuit board 3. The through-hole 3*a* is an example of a "first through-hole" in one or more embodiments of the present invention.

That is, the winding wire 11*a* is disposed across the upper side surface layer L1 and the lower side surface layer L4 of the printed circuit board 3, and is wound twice around the middle leg portion 2m of the E core 2b. In each of the surface layers L1 and L4, the winding wire 11a is separated from the cores 2a and 2b. In order to insulate the winding wire 11a from the cores 2a and 2b, a cylindrical insulator may be mounted in the vicinity of the leg portions 2m, 2r, and 2L (the same applies to a case of the winding wires 11b and 12 described later).

As illustrated in FIG. 4, the other winding wire 11b is formed of a wiring pattern 4b that is formed in the upper side surface layer L1, a metal foil 5b that is mounted on the wiring pattern 4b, a wiring pattern 4d that is formed in the lower side surface layer L4, and a metal foil 5d that is mounted on the wiring pattern 4d. The wiring patterns 4b and 4d, and the metal foils 5b and 5d are disposed to overlap with each other in the board thickness direction of the printed circuit board 3.

For example, the metal foils 5b and 5d, and the wiring patterns 4b and 4d are formed of the same conductor materials, such as a copper foil. The widths of the metal foils 5b and 5d are equal to the widths of the wiring patterns 4b and 4d.

The metal foil 5b is electrically connected to the entire upper surface (surface which is the opposite side to the printed circuit board 3) of the wiring pattern 4b, by pressure bonding, soldering, or the like. Therefore, the thickness of the winding wire 11b that is formed of the wiring pattern 4b and the metal foil 5b which are disposed in the upper side surface layer L1, is equal to the sum total of the thickness of the wiring pattern 4b and the thickness of the metal foil 5b. The width of the winding wire 11b is equal to the widths of the wiring pattern 4b and the metal foil 5b.

The metal foil 5d is electrically connected to the entire lower surface (surface which is the opposite side to the printed circuit board 3) of the wiring pattern 4d, by pressure bonding, soldering, or the like. Therefore, the thickness of the winding wire 11b that is formed of the wiring pattern 4d and the metal foil 5d which are disposed in the lower side surface layer L4, is equal to the sum total of the thickness of the wiring pattern 4d and the thickness of the metal foil 5d. The width of the winding wire 11b is equal to the widths of the wiring pattern 4d and the metal foil 5d.

The thicknesses of the metal foils 5b and 5d are larger than those of the wiring patterns 4b and 4d. The thickness of the wiring pattern 4b is equal to that of the wiring pattern 4d. The thickness of the metal foil 5b is equal to that of the metal foil 5d. Therefore, a portion (the wiring pattern 4b and the metal foil 5b) of the winding wire 11b which is disposed in the upper side surface layer L1, and the other portion (the wiring pattern 4d and the metal foil 5d) of the winding wire 11b which is disposed in the lower side surface layer L4 become equal to each other in thickness, width, and sectional area.

The thicknesses of the wiring patterns 4b and 4d are equal to those of the wiring patterns 4a and 4c. The thicknesses of the metal foils 5b and 5d are equal to those of the metal foils 5a and 5c. Therefore, the winding wire 11a and the winding wire 11b become equal to each other in thickness, width, and sectional area.

As illustrated in FIG. 5A, a portion of the winding wire 11b which is disposed in the upper side surface layer L1 is wound once around the middle leg portion 2m, to be fit into between the middle leg portion 2m, the left leg portion 2L, and the right leg portion 2r of the E core 2b. As illustrated in FIG. 4, a portion of the winding wire 11b is fit into between the upper surface of the printed circuit board 3 and the lower surface of the I core 2a. As illustrated in FIG. 5D, the other portion of the winding wire 11b which is disposed in the lower side surface layer L4 is wound once around the middle leg portion 2m, to be fit into between the middle leg portion 2m, the left leg portion 2L, and the right leg portion 2r of the E core 2b. As illustrated in FIG. 4, the other portion of the winding wire 11b is fit into between the lower surface of the printed circuit board 3 and the bottom surface of the concave portion of the E core 2b.

As illustrated in FIGS. 5A and 5D, a portion of the winding wire 11b which is disposed in the upper side surface layer L1 is electrically connected to the other portion of the winding wire 11b which is disposed in in the lower side surface layer L4, by a through-hole 3b which is formed in the printed circuit board 3. The through-hole 3b is an example of the "first through-hole" in one or more embodiments of the present invention.

In other words, the winding wire 11b is disposed across the upper side surface layer L1 and the lower side surface layer L4 of the printed circuit board 3, and is wound twice around the middle leg portion 2m of the E core 2b. In each of the surface layers L1 and L4, the winding wire 11b is wound around an outside (the right leg portion 2r side and the left leg portion 2L side) of the winding wire 11a, and is separated from the winding wire 11a, and the cores 2a and 2b.

As illustrated in FIG. 5D, in the lower side surface layer L4, the output terminal portion 11d is disposed in an end portion of the winding wire 11a which is pulled out on the outside of the core 2. The output terminal portion 11e is disposed in the end portion of the winding wire 11b which is pulled out on the outside of the core 2. As illustrated in FIG. 5A, in the upper side surface layer L1, the end portion of the winding wire 11a and the end portion of the winding wire 11b, which are pulled out on the outside of the core 2, are electrically connected to each other by joining, and the joining portion becomes the input terminal portion 11c. That is, the primary winding wire 11 of the transformer 1 is disposed across the upper side surface layer L1 and the lower side surface layer L4 of the printed circuit board 3, and is wound four times around the middle leg portion 2m of the E core 2b. The core 2 forms a magnetic path of a magnetic flux which interlinks with the primary winding wire 11. The output terminal portions 11d and 11e, and the input terminal portion 11c are an example of an "input/output terminal portion" in one or more embodiments of the present invention.

As illustrated in FIGS. 5B, 5C, and 4, the secondary winding wire 12 of the transformer 1 is wound in the internal layers L2 and L3 of the printed circuit board 3, to be wound between the leg portions 2m, 2L, and 2r of the E core 2b.

As illustrated in FIG. 4, a portion of the secondary winding wire 12 is formed of a wiring pattern 4e that is formed in the upper side internal layer L2, and the other portion of the secondary winding wire 12 is formed of a wiring pattern 4f that is formed in the lower side internal layer L3. The wiring pattern 4e is equal to the wiring pattern 4f in width, thickness, and sectional area.

As illustrated in FIG. 5B, in the upper side internal layer L2, the wiring pattern 4e is wound four times around the middle leg portion 2m, to be fit into between the middle leg portion 2m, the left leg portion 2L, and the right leg portion 2r of the E core 2b. As illustrated in FIG. 5C, in the lower side internal layer L3, the wiring pattern 4f is wound four times around the middle leg portion 2m, to be fit into between the middle leg portion 2m, the left leg portion 2L, and the right leg portion 2r of the E core 2b.

As illustrated in FIGS. 5B and 5C, one end of the wiring pattern 4e which is disposed in the upper side internal layer L2 is electrically connected to one end of the wiring pattern 4f which is disposed in in the lower side internal layer L3, by a through-hole 3c which is formed in the printed circuit board 3. The through-hole 3c is an example of a "second through-hole" in one or more embodiments of the present invention.

In other words, the secondary winding wire 12 of the transformer 1 is disposed across the upper side internal layer L2 and the lower side internal layer L3 of the printed circuit board 3, and is wound eight times around the middle leg portion 2m of the E core 2b. In each of the internal layers L2 and L3, the secondary winding wire 12 is separated from the cores 2a and 2b.

As illustrated in FIG. 4, the thicknesses of the wiring patterns 4e and 4f of the internal layers L2 and L3 are equal to those of the wiring patterns 4a to 4d of the surface layers L1 and L4. The widths of the wiring patterns 4e and 4f of the internal layers L2 and L3 become smaller than those of the wiring patterns 4a to 4d of the surface layers L1 and L4. That is, the sectional area of the secondary winding wire 12 of the transformer 1 becomes smaller than that of the primary winding wire 11.

As illustrated in FIG. 5B, in the upper side internal layer L2, the output terminal portion 12d is disposed in the end portion of the secondary winding wire 12 which is pulled out on the outside of the core 2. As illustrated in FIG. 5C, in the lower side internal layer L3, the input terminal portion 12c is disposed in the end portion of the secondary winding wire 12 which is pulled out on the outside of the core 2. That is, the secondary winding wire 12 of the transformer 1 is disposed across the upper side internal layer L2 and the lower side internal layer L3 of the printed circuit board 3, and is wound eight times around the middle leg portion 2m of the E core 2b. The core 2 forms the magnetic path of the magnetic flux which interlinks with the secondary winding wire 12.

Figure 6:
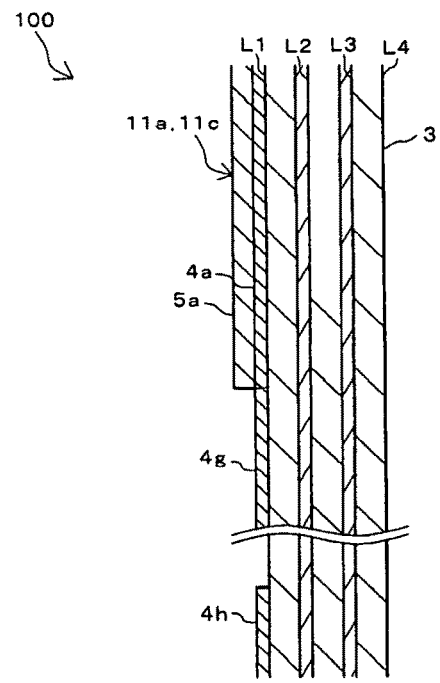
FIG. 6 is a sectional view taken along A-A line in FIG. 5A.
Figure 7:
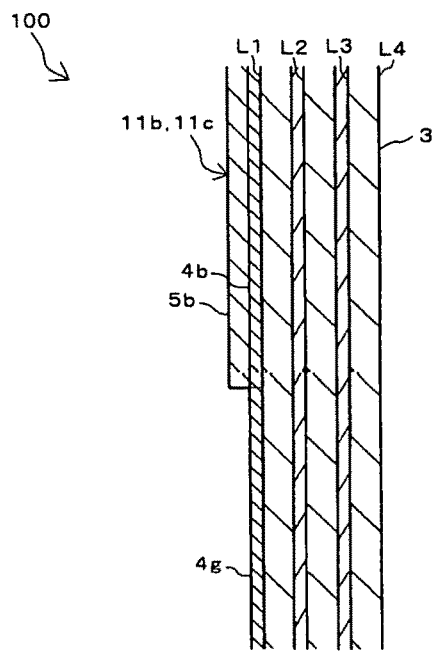
FIG. 7 is a sectional view taken along B-B line in FIG. 5A.
Figure 8:
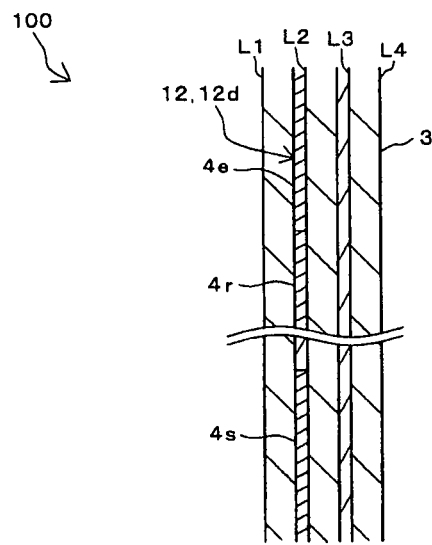
FIG. 8 is a sectional view taken along C-C line in FIG. 5B.
Figure 9:
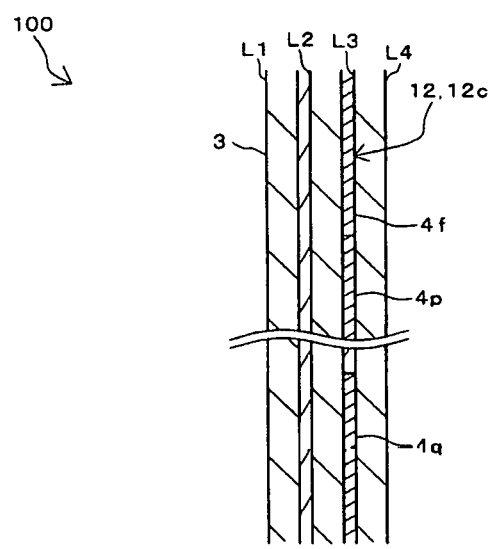
FIG. 9 is a sectional view taken along D-D line in FIG. 5C.
Figure 10:
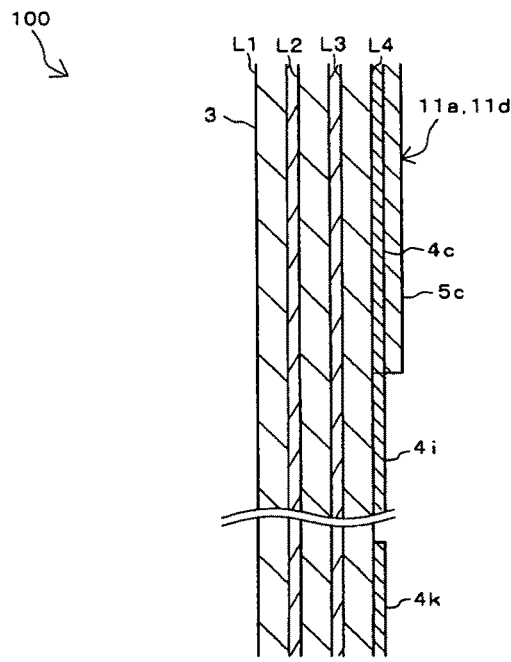
FIG. 10 is a sectional view taken along E-E line in FIG. 5D.
Figure 11:
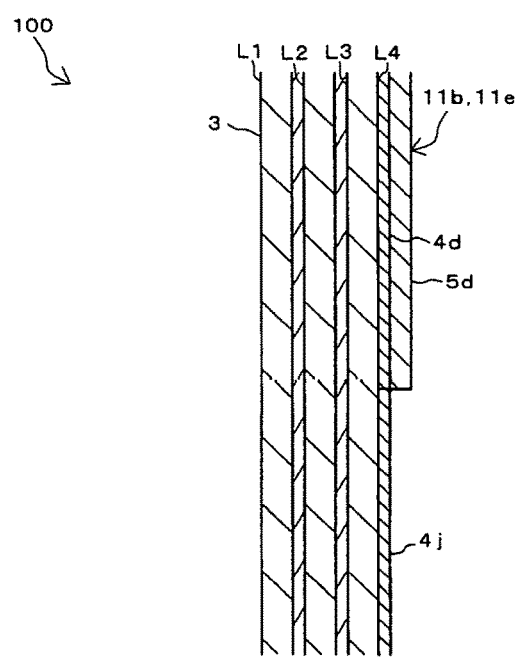
FIG. 11 is a sectional view taken along F-F line in FIG. 5D.

FIG. 6 is a sectional view taken along A-A line in FIG. 5A. FIG. 7 is a sectional view taken along B-B line in FIG. 5A. In FIGS. 6 and 7, the illustration of the conductors which are in the layers L2, L3, and L4 except for the upper side surface layer L1 will be omitted. FIG. 8 is a sectional view taken along C-C line in FIG. 5B. In FIG. 8, the illustration of the conductors which are in the layers L1, L3, and L4 except for the upper side internal layer L2 will be omitted. FIG. 9 is a sectional view taken along D-D line in FIG. 5C. In FIG. 9, the illustration of the conductors which are in the layers L1, L2, and L4 except for the lower side internal layer L3 will be omitted. FIG. 10 is a sectional view taken along E-E line in FIG. 5D. FIG. 11 is a sectional view taken along F-F line in FIG. 5D. In FIGS. 10 and 11, the illustration of the conductors which are in the layers L1, L2, and L3 except for the lower side surface layer L4 will be omitted.

As illustrated in FIGS. 5A, 6, and 7, a wiring pattern 4g is electrically connected to the input terminal portion 11c of the primary winding wire 11 of the transformer 1. The wiring pattern 4g is a wiring that electrically connects the choke coil 20 illustrated in FIG. 1 to the input terminal portion 11c. As illustrated in FIG. 5A, the width of the input terminal portion 11c is larger than that of the winding wire 11a or that of the winding wire 11b. The width of the wiring pattern 4g is larger than those of the winding wires 11a and 11b or that of the input terminal portion 11c.

As illustrated in FIGS. 6 and 7, the thickness of the input terminal portion 11c is equal to those of the winding wires 11a and 11b. The thickness of the wiring pattern 4g is smaller than that of the input terminal portion 11c or those of the winding wires 11a and 11b. The thickness of the wiring pattern 4g is equal to those of the wiring patterns 4a and 4b.

As illustrated in FIG. 5A, another wiring pattern 4h is formed at a position that is separated from the core 2 of the upper side surface layer L1. The wiring pattern 4h is not electrically connected to the input terminal portion 11c, or the winding wires 11a and 11b. As illustrated in FIGS. 6 and 7, the thickness of the wiring pattern 4h is smaller than that of the input terminal portion 11c or those of the winding wires 11a and 11b. The thickness of the wiring pattern 4h becomes equal to those of the wiring patterns 4a, 4b, and 4g.

As illustrated in FIGS. 5D and 10, a wiring pattern 4i is electrically connected to one output terminal portion 11d of the primary winding wire 11. The wiring pattern 4i is a wiring that electrically connects the switching element 31 illustrated in FIG. 1 to the output terminal portion 11d. As illustrated in FIG. 5D, the width of the output terminal portion 11d is equal to that of the winding wire 11a. The width of the wiring pattern 4i becomes larger than that of the output terminal portion 11d or those of the winding wires 11a and 11b.

As illustrated in FIG. 10, the thickness of the output terminal portion 11d becomes equal to that of the winding wire 11a, and the thickness of the wiring pattern 4i becomes smaller than that of the output terminal portion 11d or that of the winding wire 11a. The thickness of the wiring pattern 4i becomes equal to that of the wiring pattern 4c.

As illustrated in FIGS. 5D and 11, a wiring pattern 4j is electrically connected to the other output terminal portion 11e of the primary winding wire 11. The wiring pattern 4j is a wiring that electrically connects the switching element 32 illustrated in FIG. 1 to the output terminal portion 11e. As illustrated in FIG. 5D, the width of the output terminal portion 11e becomes equal to that of the winding wire 11b. The width of the wiring pattern 4j becomes larger than that of the output terminal portion 11e or that of the winding wire 11b.

As illustrated in FIG. 11, the thickness of the output terminal portion 11e becomes equal to that of the winding wire 11b. The thickness of the wiring pattern 4j becomes smaller than that of the output terminal portion 11e or that of the winding wire 11b. The thickness of the wiring pattern 4j becomes equal to that of the wiring pattern 4d.

As illustrated in FIG. 5D, another wiring pattern 4k is formed at the position that is separated from the core 2 of the lower side surface layer L4. The wiring pattern 4k is not electrically connected to the output terminal portions 11d and 11e, or the winding wires 11a and 11b. As illustrated in FIG. 10, the thickness of the wiring pattern 4k becomes smaller than that of the output terminal portion 11d or that of the winding wire 11a. The thickness of the wiring pattern 4k becomes smaller than that of the output terminal portion 11e or that of the winding wire 11b, illustrated in FIG. 11. The thickness of the wiring pattern 4k becomes equal to those of the wiring patterns 4c, 4d, and 4j.

As illustrated in FIGS. 5C and 9, in the lower side internal layer L3, a wiring pattern 4p is electrically connected to the input terminal portion 12c of the secondary winding wire 12 of the transformer 1. The wiring pattern 4p is a wiring that electrically connects the capacitors 43 and 44 illustrated in FIG. 1 to the input terminal portion 12c. As illustrated in FIG. 5C, the width of the wiring pattern 4f of the secondary winding wire 12, the width of the input terminal portion 12c, and the width of the wiring pattern 4p become equal to each other. As illustrated in FIG. 9, the thickness of the wiring pattern 4*f*, the thickness of the input terminal portion 12*c*, and the thickness of the wiring pattern 4*p* become equal to each other.

As illustrated in FIG. 5C, another wiring pattern 4*q* is formed at the position that is separated from the core 2 of the lower side internal layer L3. The wiring pattern 4*q* is not electrically connected to the input terminal portion 12*c* or the wiring pattern 4*f* of the secondary winding wire 12. As illustrated in FIG. 9, the thickness of the wiring pattern 4*q* becomes equal to that of the input terminal portion 12*c* and those of the wiring patterns 4*f* and 4*p*.

As illustrated in FIGS. 5B and 8, in the upper side internal layer L2, a wiring pattern 4*r* is electrically connected to the output terminal portion 12*d* of the secondary winding wire 12 of the transformer 1. The wiring pattern 4*r* is a wiring that electrically connects the connection point of the rectifier diodes 41 and 42 illustrated in FIG. 1 to the output terminal portion 12*d*. As illustrated in FIG. 5B, the width of the wiring pattern 4*e* of the secondary winding wire 12, the width of the output terminal portion 12*d*, and the width of the wiring pattern 4*r* become equal to each other. As illustrated in FIG. 8, the thickness of the wiring pattern 4*e*, the thickness of the output terminal portion 12*d*, and the thickness of the wiring pattern 4*r* become equal to each other.

As illustrated in FIG. 5B, another wiring pattern 4*s* is formed at the position that is separated from the core 2 of the upper side internal layer L2. The wiring pattern 4*s* is not electrically connected to the output terminal portion 12*d* or the wiring pattern 4*e* of and the secondary winding wire 12. As illustrated in FIG. 8, the thickness of the wiring pattern 4*s* becomes equal to that of the output terminal portion 12*d* and those of the wiring patterns 4*e* and 4*r*.

The wiring patterns 4*a* to 4*k*, and 4*p* to 4*s* which are disposed in the respective layers L1 to L4 of the printed circuit board 3 are formed of the same metal materials (copper foils), and are the same in thickness. The wiring patterns 4*a* to 4*d* are an example of a "first wiring pattern" in one or more embodiments of the present invention. The wiring patterns 4*e* and 4*f* are an example of a "second wiring pattern" in one or more embodiments of the present invention. The wiring patterns 4*g*, 4*i*, and 4*j* are an example of a "third wiring pattern" in one or more embodiments of the present invention. The wiring patterns 4*h* and 4*k* are an example of a "fourth wiring pattern" in one or more embodiments of the present invention.

Regarding the primary winding wire 11 of the transformer 1, after the electric current is input to the input terminal portion 11*c* from the wiring pattern 4*g* of the upper side surface layer L1 illustrated in FIG. 5A, the electric current flows into the winding wire 11*a* or the winding wire 11*b*.

Since the winding wire 11*a* of the upper side surface layer L1 is formed of the wiring pattern 4*a* and the metal foil 5*a*, the electric current flowing into the winding wire 11*a* flows through the wiring pattern 4*a* and the metal foil 5*a*. After the electric current passes through the through-hole 3*a* from the wiring pattern 4*a* and the metal foil 5*a*, the electric current flows into the winding wire 11*a* of the lower side surface layer L4 illustrated in FIG. 5D. Since the winding wire 11*a* of the lower side surface layer L4 is formed of the wiring pattern 4*c* and the metal foil 5*c*, the electric current flowing into the winding wire 11*a* flows through the wiring pattern 4*c* and the metal foil 5*c*, and is output to the wiring pattern 4*i* from the output terminal portion 11*d*.

Since the winding wire 11*b* of the upper side surface layer L1 illustrated in FIG. 5A is formed of the wiring pattern 4*b* and the metal foil 5*b*, the electric current flowing into the winding wire 11*b* flows through the wiring pattern 4*b* and the metal foil 5*b*. After the electric current passes through the through-hole 3*b* from the wiring pattern 4*b* and the metal foil 5*b*, the electric current flows into the winding wire 11*b* of the lower side surface layer L4 illustrated in FIG. 5D. Since the winding wire 11*b* of the lower side surface layer L4 is formed of the wiring pattern 4*d* and the metal foil 5*d*, the electric current flowing into the winding wire 11*b* flows through the wiring pattern 4*d* and the metal foil 5*d*, and is output to the wiring pattern 4*j* from the output terminal portion 11*e*.

Regarding the secondary winding wire 12 of the transformer 1, after the electric current is input to the input terminal portion 12*c* from the wiring pattern 4*p* of the lower side internal layer L3 illustrated in FIG. 5C, the electric current flows into the wiring pattern 4*f* which forms a portion of the secondary winding wire 12. After the electric current flowing through the wiring pattern 4*f* passes through the through-hole 3*c*, the electric current flows into the wiring pattern 4*e* which forms the other portion of the secondary winding wire 12 of the upper side internal layer L2 illustrated in FIG. 5B. Therefore, the electric current flowing through the wiring pattern 4*e* is output to the wiring pattern 4*r* from the output terminal portion 12*d*.

The electric current which is larger than that of the secondary winding wire 12 flows through the primary winding wire 11 of the transformer 1. Therefore, as described above, the sectional area of the primary winding wire 11 is larger than that of the secondary winding wire 12 (FIG. 4).

According to one or more embodiments described above, in the transformer integrated type printed circuit board 100, the primary winding wire 11 is disposed in the surface layers L1 and L4 of the multilayered printed circuit board 3, and the secondary winding wire 12 is disposed in the internal layers L2 and L3 of the printed circuit board 3, to be wound between the leg portions 2*m*, 2*r*, and 2L of the core 2 of the transformer 1. Therefore, the primary winding wire 11 through which the electric current that is larger than that of the secondary winding wire 12 flows is large not only in width, but also in thickness, in comparison with the secondary winding wire 12. Accordingly, the sectional area of the primary winding wire 11 is made large, thereby, it is possible to cause the large electric current to stably flow through the primary winding wire 11, and to keep down an occupied area of the primary winding wire 11 on the surface layers L1 and L4 of the printed circuit board 3 small. Since the secondary winding wire 12 is small in width, and is small in thickness in comparison with the primary winding wire 11, the sectional area thereof is made small, but the electric current which is smaller than the electric current flowing through the primary winding wire 11 flows through the secondary winding wire 12, thereby, it is possible to cause the electric current to stably flow through the secondary winding wire 12, and to keep down the occupied area of the secondary winding wire 12 on the internal layers L2 and L3 of the printed circuit board 3 small. As a result, it is possible to wind the primary winding wire 11 and the secondary winding wire 12 of the transformer 1 such that the primary winding wire 11 and the secondary winding wire 12 of the transformer 1 are fit into between the leg portions 2*m*, 2*r*, and 2L of the core 2, and it is possible to miniaturize the transformer 1.

Generally, in the multilayered printed circuit board, if the thickness of the wiring pattern of the surface layer is made larger than that of the wiring pattern of the internal layer, manufacturing of the printed circuit board becomes difficult, and a manufacturing cost is increased, in comparison with a case where the thickness of the wiring pattern of the surface layer is made the same as that of the wiring pattern of the internal layer. However, in one or more embodiments described above, the thicknesses of the wiring patterns 4a to 4d, and 4g to 4k of the surface layers L1 and L4 are equal to those of the wiring patterns 4e, 4f, 4p to 4s of the internal layers L2 and L3, in the multilayer printed circuit board 3. The primary winding wire 11 of the transformer 1 is formed of the wiring patterns 4a to 4d of the surface layers L1 and L4, and the metal foils 5a to 5d that are mounted on the wiring patterns 4a to 4d. The secondary winding wire 12 of the transformer 1 is formed of the wiring patterns 4e and 4f of the internal layers L2 and L3. Therefore, it is possible to easily make the thickness of the primary winding wire 11 larger than the thickness of the secondary winding wire 12. Moreover, it is possible easily manufacture the printed circuit board 3, the transformer 1, and the transformer integrated type printed circuit board 100, and to keep down the manufacturing cost low, in comparison with a case where the thicknesses of the wiring patterns are different from each other in the surface layer and the internal layer.

In one or more embodiments described above, the wiring patterns 4a to 4d which form the primary winding wire 11 of the transformer 1, and the metal foils 5a to 5d are formed of the same metal materials, and are formed to be equal to each other in width. The wiring patterns 4a to 4d, and the wiring patterns 4e and 4f which form the secondary winding wire 12 are formed of the same metal materials, and are formed to be equal to each other in thickness. Therefore, the metal foils 5a to 5d are easily mounted on the wiring patterns 4a to 4d, thereby, it is possible to more easily make the thickness of the primary winding wire 11 larger than the thickness of the secondary winding wire 12. Furthermore, it is possible to enhance electrification efficiency of the primary winding wire 11.

In one or more embodiments described above, in the transformer 1, the primary winding wire 11 and the secondary winding wire 12 are wound around the middle leg portion 2m, to be fit into between the middle leg portion 2m, the left leg portion 2L and the right leg portion 2r, in the three leg portions 2r, 2m, and 2L which are formed to be parallel to each other in one direction of the core 2. Even in this case, since the primary winding wire 11 of the transformer 1 is made large not only in width, but also in thickness and sectional area, it is possible to wind the primary winding wire 11 around the middle leg portion 2m such that the primary winding wire 11 is fit into between the middle leg portion 2m, the left leg portion 2L, and the right leg portion 2r of the core 2 without hindrance. Since the secondary winding wire 12 of the transformer 1 is small in width in comparison with the primary winding wire 11, it is possible to secure the desired number of winding times of the secondary winding wire 12, and it is possible to wind the secondary winding wire 12 around the middle leg portion 2m such that the secondary winding wire 12 is fit into between the middle leg portion 2m, the left leg portion 2L, and the right leg portion 2r of the core 2.

In one or more embodiments described above, since a space at the position which is separated from the core 2 in the surface layers L1 and L4 of the printed circuit board 3 is larger than the space in the vicinity of the core 2, the input terminal portion 11c, and the output terminal portions 11d and 11e of the primary winding wire 11 of the transformer 1, and the wiring patterns 4g, 4i, and 4j that are electrically connected to the input/output terminal portions 11c to 11e are disposed at the position described above. The thicknesses of the wiring patterns 4g, 4i, and 4j are made smaller than that of the primary winding wire 11, and the widths of the wiring patterns 4g, 4i, and 4j are made larger than that of the primary winding wire 11. Thereby, it is possible to easily form the wide wiring patterns 4g, 4i, and 4j in the upper side surface layer L1. Even in a case where the thicknesses of the wiring patterns 4g, 4i, and 4j are not made large, the widths thereof are made large, thereby, the sectional areas thereof are made large, and it is possible to cause the large electric current to stably flow through the wiring patterns 4g, 4i, and 4j, in the same manner as the primary winding wire 11.

In one or more embodiments described above, the wiring patterns 4h and 4k which is not electrically connected to the input terminal portion 11c, or the output terminal portions 11d and 11e of the primary winding wire 11 of the transformer 1 are disposed at the position that is separated from the core 2 in the surface layers L1 and L4 of the printed circuit board 3. The thicknesses of the wiring patterns 4h and 4k are made smaller than that of the primary winding wire 11. Accordingly, in the surface layers L1 and L4, the thicknesses of the wiring patterns 4h and 4k are made equal to those of the other wiring patterns 4a to 4d, 4g, 4i, and 4h, thereby, it is possible to easily form the wide wiring patterns 4h and 4k.

In one or more embodiments described above, the wiring patterns 4a to 4d, and the metal foils 5a to 5d which form the primary winding wire 11 of the transformer 1, are disposed in the surface layers L1 and L4 that are formed on both board surfaces of the printed circuit board 3, and the primary winding wires 11 in the layer L1 and L4 which are different from each other are electrically connected to each other by the through-holes 3a and 3b. Therefore, in the primary winding wire 11 of the transformer 1, it is possible to extend a length of the wire, and to increase the number of winding times.

In one or more embodiments described above, the wiring patterns 4e and 4f that form the secondary winding wire 12 of the transformer 1 are disposed in the internal layers L2 and L3 which are different from each other in the printed circuit board 3, and the secondary winding wires 12 in the layer L2 and L3 which are different from each other are electrically connected to each other by the through-hole 3c. Therefore, in the secondary winding wire 12 of the transformer 1, it is possible to extend the length of the wire, and to increase the number of winding times.

In one or more embodiments of the present invention, it is possible to adopt various embodiments in addition to one or more embodiments described above. For example, in one or more embodiments described above, an example in which each of the winding wires 11a and 11b of the primary winding wire 11 of the transformer 1 is wound once around each of the surface layers L1 and L4 of the printed circuit board 3, and the secondary winding wire 12 is wound four times around each of the internal layers L2 and L3 is illustrated, but one or more embodiments of the present invention is not limited thereto. The number of winding times of each winding wire of the transformer in each layer of the multilayered printed circuit board may be any as long as the number of winding times is appropriately set. A configuration of division-nondivision in the center tap of the primary winding wire or the secondary winding wire of the transformer may be any as long as the configuration is selected as necessary.

Figure 12A:
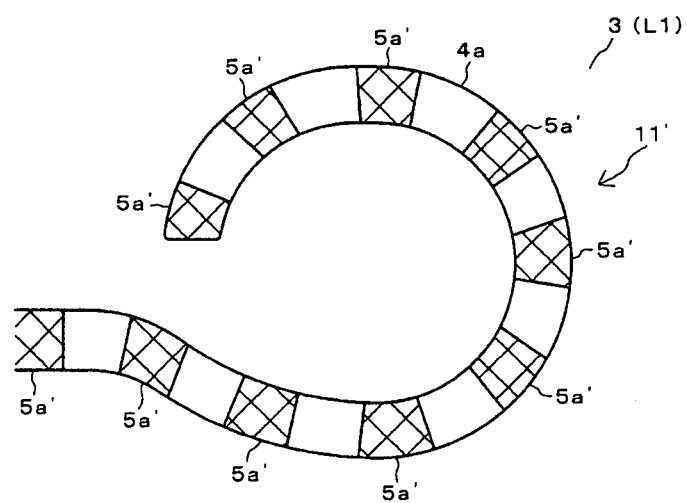
FIGS. 12A and 12B are diagrams illustrating a transformer integrated type printed circuit board according to another embodiment of the present invention.
Figure 12B:
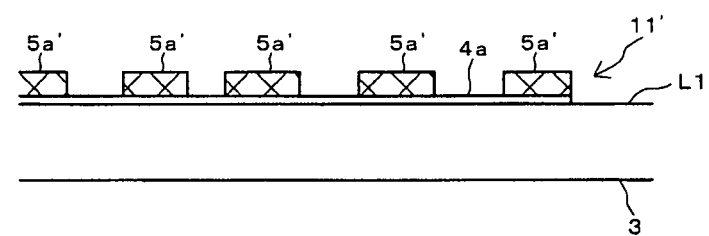

In one or more embodiments described above, an example in which the primary winding wire 11 of the transformer 1 is configured by mounting the metal foils 5a to 5d onto the entire surface that is the opposite side to the printed circuit board 3 in the wiring patterns 4a to 4d which are formed on the surface layers L1 and L4 of the printed circuit board 3 is illustrated, but one or more embodiments of the present invention is not limited thereto. In addition thereto, for example, as illustrated in FIGS. 12A and 12B, a metal foil 5a' is mounted by pressure bonding, soldering, or the like, in spots the surface that is the opposite side to the printed circuit board 3 in the wiring pattern 4a which is formed in the surface layer L1 of the printed circuit board 3, thereby, a primary winding wire 11' of the transformer may be configured. FIG. 12A illustrates a state of the primary winding wire 11' of the transformer in the surface layer L1 of the printed circuit board 3 when viewed from above, and FIG. 12B illustrates a state of the primary winding wire 11' when viewed from the side.

In one or more embodiments described above, an example in which the primary winding wire 11 of the transformer 1 is formed of the wiring patterns 4a to 4d that are formed in the surface layers L1 and L4 of the printed circuit board 3, and the metal foils 5a to 5d that are mounted on the wiring patterns 4a to 4d is illustrated, but one or more embodiments of the present invention is not limited thereto. In addition thereto, for example, a conductor 5x is formed by working a metal plate having conductivity into a spiral shape as illustrated in FIG. 13A to 13C or 14A and 14B, and the conductor 5x is surface-mounted on the surface layer L1 of the printed circuit board 3, thereby, primary winding wires 11" and 11'" of the transformer may be configured.

Figure 13A:
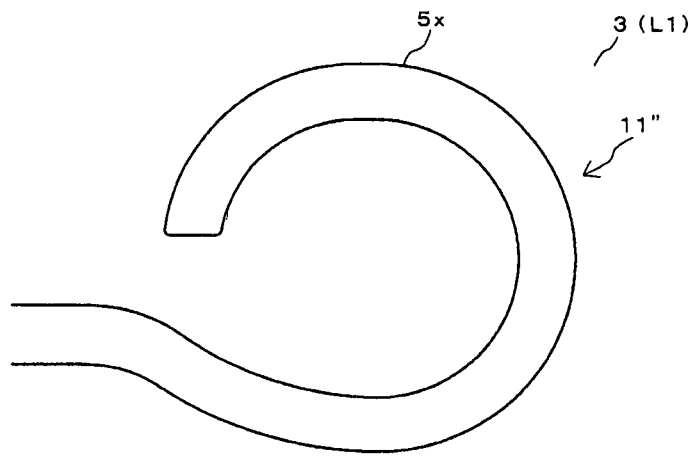
FIGS. 13A to 13C are diagrams illustrating a transformer integrated type printed circuit board according to still another embodiment of the present invention.
Figure 13B:
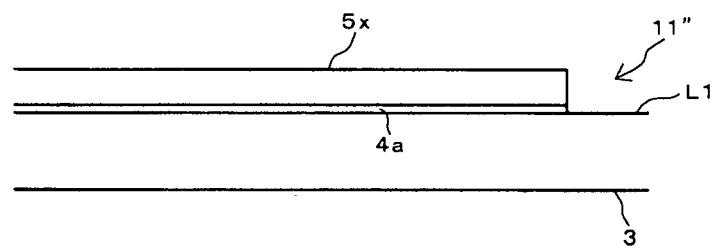
Figure 13C:
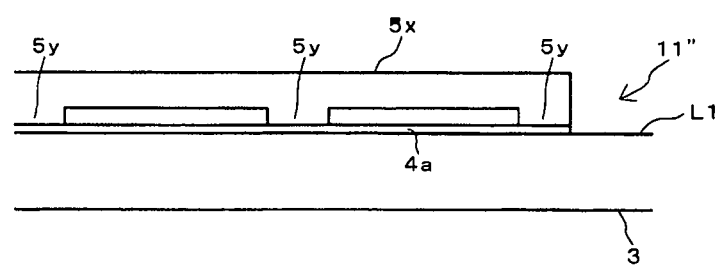

FIG. 13A illustrates a state of the primary winding wire 11" of the transformer 1 in the surface layer L1 of the printed circuit board 3 when viewed from above, and FIG. 13B or FIG. 13C illustrates a state of the primary winding wire 11" when viewed from the side. In the example of FIGS. 13A to 13C, the wiring pattern 4a is formed into a spiral shape in the surface layer L1 of the printed circuit board 3 to overlap with the conductor 5x. In the example of FIG. 13B, the entire lower surface of the conductor 5x is electrically connected onto the wiring pattern 4a by soldering or the like. In the example of FIG. 13C, leg portions 5y are disposed in spots of the conductor 5x, and each of the leg portions 5y is electrically connected onto the wiring pattern 4a by soldering or the like. A portion except for the leg portion 5y in the conductor 5x is in a state of floating from the wiring pattern 4a.

Figure 14A:
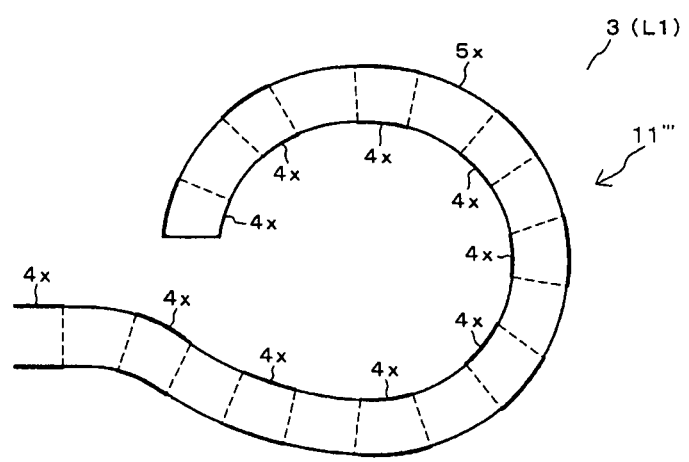
FIGS. 14A and 14B are diagrams illustrating a transformer integrated type printed circuit board according to yet another embodiment of the present invention.
Figure 14B:
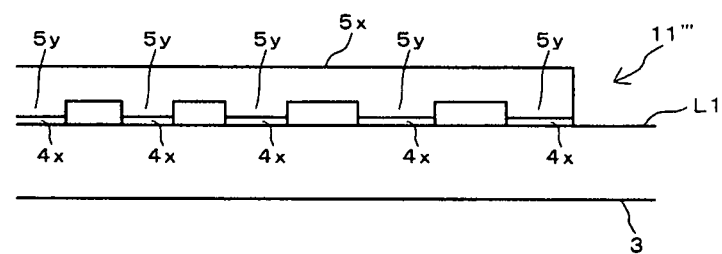

FIG. 14A illustrates a state of the primary winding wire 11' of the transformer 1 in the surface layer L1 of the printed circuit board 3 when vied from above, and FIG. 14B illustrates a state of the primary winding wire 11'" when viewed from the side. In the example of FIGS. 14A and 14B, a plurality of pads 4x are formed to be dotted into a spiral shape in the surface layer L1 of the printed circuit board 3, and the leg portion 5y of the conductors 5x is electrically connected onto the pad 4x by soldering or the like. A portion except for the leg portion 5y in the conductor 5x is in a state of floating from the surface layer L1.

In one or more embodiments described above, an example in which the wiring patterns 4a and 4d, and the metal foils (conductors) 5a to 5d which form the primary winding wire 11 of the transformer 1 are formed of the copper foils is illustrated, but one or more embodiments of the present invention is not limited only thereto. The wiring pattern and the conductor which form the primary winding wire of the transformer may be formed of a conductive material in addition to the copper foil. The wiring pattern and the conductor may be formed of the same conductive materials, or may be formed of the conductive materials which are different from each other.

In one or more embodiments described above, an example in which the thicknesses of the wiring patterns 4a to 4d, and 4g to 4k that are formed in the surface layers L1 and L4 of the printed circuit board 3 are equal to those of the wiring patterns 4e, 4f, and 4p to 4s that are formed in the internal layers L2 and L3 of the printed circuit board 3 is illustrated, but one or more embodiments of the present invention is not limited thereto. The thickness of the wiring pattern of the surface layer of the printed circuit board may be different from the thickness of the wiring pattern of the internal layer. The width and the thickness of the wiring pattern or the metal foil may be any as long as the width and the thickness thereof is appropriately set.

In one or more embodiments described above, an example in which the winding wires in the layers that are different from each other in the transformer 1 are electrically connected to each other by the through-holes 3a to 3c is illustrated, but one or more embodiments of the present invention is not limited thereto. In addition thereto, for example, one or more vias, or a metal substance having conductivity and thermal conductivity, as a penetration conductor, may be disposed in the printed circuit board, and the winding wires in the layers which are different from each other are electrically connected to each other by the penetration conductor.

In one or more embodiments described above, an example in which the core 2 is obtained by combining the I core 2a and the E core 2b illustrated, but one or more embodiments of the present invention is not limited thereto. In addition thereto, for example, two E cores, or other cores may be used. Moreover, a notch or the like may be formed in the printed circuit board, in addition to the penetration hole, as an insertion portion of the printed circuit board into which the leg portion of the core is inserted.

In one or more embodiments described above, an example in which the transformer 1 is integrated with the four-layered printed circuit board 3 having two surface layers L1 and L4, and two internal layers L2 and L3 is illustrated, but one or more embodiments of the present invention is not limited thereto. The transformer may be integrated with the printed circuit board having at least one surface layer and at least one internal layer.

In one or more embodiments described above, a case where one or more embodiments of the present invention is applied to the transformer integrated type printed circuit board 100 that is used in the switching power source apparatus for the vehicle is exemplified. However, it is possible to apply one or more embodiments of the present invention to the transformer integrated type printed circuit board that is used in the switching power source apparatus for other purposes in addition to the vehicle, or an apparatus in addition to the switching power source apparatus.

While the invention has been described with respect to a limited number of embodiments, those skilled in the art, having benefit of this disclosure, will appreciate that other embodiments can be devised which do not depart from the scope of the invention as disclosed herein. According, the scope of the invention should be limited only by the attached claims.

The invention claimed is:

1. A transformer integrated type printed circuit board comprising:
   a transformer that comprises a core, a primary winding wire, and a secondary winding wire; and a printed circuit board that comprises a surface layer and an internal layer in which wiring patterns are respectively formed, and has a plurality of insertion portions into which a plurality of leg portions of the core are respectively inserted, wherein the primary winding wire is disposed in the surface layer of the printed circuit board so as to be wound between the leg portions, wherein the secondary winding wire is disposed in the internal layer of the printed circuit board so as to be wound between the leg portions, wherein the primary winding wire is small in number of windings, is large in width, and is large in thickness, in comparison with the secondary winding wire, wherein the primary winding wire comprises: a first wiring pattern that is formed in the surface layer; and a conductor that is mounted on the first wiring pattern, and wherein the secondary winding wire comprises a second wiring pattern that is formed in the internal layer.

2. The transformer integrated type printed circuit board according to claim 1, wherein the conductor of the primary winding wire comprises a metal foil which is a same material as the first wiring pattern, and wherein a width of the metal foil is equal to a width of the first wiring pattern.

3. The transformer integrated type printed circuit board according to claim 1, wherein a third wiring pattern that is electrically connected to an input/output terminal portion of the primary winding wire is formed at a position that is separated from the core in the surface layer, and wherein the third wiring pattern is large in width, and is small in thickness, in comparison with the primary winding wire.

4. The transformer integrated type printed circuit board according to claim 1, wherein a fourth wiring pattern that is not electrically connected to an input/output terminal portion of the primary winding wire is formed at a position that is separated from the core in the surface layer, and wherein the fourth wiring pattern is small in thickness, in comparison with the primary winding wire.

5. The transformer integrated type printed circuit board according to claim 1, wherein the primary winding wires are disposed in the surface layers that are formed on both of board surfaces of the printed circuit board, wherein the secondary winding wires are disposed in a plurality of the internal layers that are formed inside the printed circuit board, and wherein the printed circuit board has: a first through-hole that electrically connects the primary winding wires to each other in the surface layers that are different from each other; and a second through-hole that electrically connects the secondary winding wires to each other in the internal layers which are different from each other.

6. The transformer integrated type printed circuit board according to claim 1, wherein the core comprises three leg portions that are formed to be parallel to each other in one direction, and wherein the primary winding wire and the secondary winding wire are wound around a middle leg portion to be fit into between the middle leg portion of the three leg portions and left and right leg portions which are located on left and right of the middle leg portion.

* * * * *